(12) United States Patent
Voiron et al.

(10) Patent No.: US 11,538,637 B2
(45) Date of Patent: Dec. 27, 2022

(54) SUBSTRATES EMPLOYING SURFACE-AREA AMPLIFICATION, FOR USE IN FABRICATING CAPACITIVE ELEMENTS AND OTHER DEVICES

(71) Applicants: Murata Manufacturing Co., Ltd., Nagaokakyo (JP); COMMISSARIAT A L'ENERGIE ATOMIQUE ET AUX ENERGIES ALTERNATIVES, Paris (FR)

(72) Inventors: Frédéric Voiron, Barraux (FR); Julien El Sabahy, Grenoble (FR); Guy Parat, Claix (FR)

(73) Assignees: MURATA MANUFACTURING CO., LTD., Nagaokakyo (JP); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 41 days.

(21) Appl. No.: 17/358,357

(22) Filed: Jun. 25, 2021

(65) Prior Publication Data

US 2021/0335552 A1 Oct. 28, 2021

Related U.S. Application Data

(63) Continuation of application No. 16/739,397, filed on Jan. 10, 2020, now Pat. No. 11,087,927, which is a (Continued)

(30) Foreign Application Priority Data

Jul. 10, 2017 (EP) ..................................... 17305897

(51) Int. Cl.
*H01G 4/33* (2006.01)
*C25D 11/02* (2006.01)
(Continued)

(52) U.S. Cl.
CPC ............... *H01G 4/33* (2013.01); *C25D 11/02* (2013.01); *G01N 27/227* (2013.01);
(Continued)

(58) Field of Classification Search
CPC .................................................. H01L 21/4853
See application file for complete search history.

(56) References Cited

U.S. PATENT DOCUMENTS 5,098,860 A * 3/1992 Chakravorty ......... H01L 21/288
257/E21.174
5,217,920 A * 6/1993 Mattox ............. H01L 21/76202
257/E21.538
(Continued)

OTHER PUBLICATIONS

International Search Report issued for PCT/EP2018/068632, dated Oct. 11, 2018.
(Continued)

*Primary Examiner* — William A Harriston
(74) *Attorney, Agent, or Firm* — ArentFox Schiff LLP (57) ABSTRACT

A substrate that includes a base layer having a first principal surface defining a plurality of first trenches and intervening first lands, and a cover layer provided over the first principal surface of the base layer and covering the first trenches and first lands substantially conformally, wherein the surface of the cover layer remote from the first principal surface of the base layer comprises a plurality of second trenches and intervening second lands defined at a smaller scale than the first trenches and first lands. The substrate may be used to fabricate a capacitive element in which thin film layers are provided and conformally cover the second trenches and second lands of the cover layer, to create a metal-insulator-metal structure having high capacitance density.

13 Claims, 7 Drawing Sheets

Related U.S. Application Data continuation of application No. PCT/EP2018/068632, filed on Jul. 10, 2018.

(51) Int. Cl.
  *G01N 27/22* (2006.01)
  *H01L 21/48* (2006.01)
  *H01L 23/498* (2006.01)
  *H01L 25/16* (2006.01)
  *H01L 49/02* (2006.01)
  *H01L 23/00* (2006.01)

(52) U.S. Cl.
  CPC ........ *H01L 21/486* (2013.01); *H01L 21/4853* (2013.01); *H01L 23/49811* (2013.01); *H01L 23/49827* (2013.01); *H01L 23/49838* (2013.01); *H01L 25/16* (2013.01); *H01L 28/90* (2013.01); *H01L 24/16* (2013.01); *H01L 2224/16225* (2013.01)

(56) References Cited

U.S. PATENT DOCUMENTS

| | | | |
|---|---|---|---|
| 5,481,084 A * | 1/1996 | Patrick | B22D 11/008 148/222 |
| 5,660,680 A * | 8/1997 | Keller | C23C 16/01 216/2 |
| 6,033,982 A * | 3/2000 | Lopatin | H01L 21/31687 257/664 |
| 6,139,713 A * | 10/2000 | Masuda | C25D 11/16 205/213 |
| 6,140,234 A * | 10/2000 | Uzoh | H01L 21/76873 438/677 |
| 6,387,818 B1 * | 5/2002 | Lopatin | H01L 21/31144 438/723 |
| 6,432,795 B1 | 8/2002 | Lee | |
| 6,433,379 B1 * | 8/2002 | Lopatin | H01L 28/40 257/532 |
| 6,459,565 B1 * | 10/2002 | Lessner | H01G 9/045 29/25.03 |
| 6,556,030 B1 * | 4/2003 | Akram | G01R 1/0466 324/750.05 |
| 7,667,292 B2 * | 2/2010 | Giraudin | H01L 27/0805 257/532 |
| 7,886,437 B2 * | 2/2011 | Nashner | H05K 3/445 438/689 |
| 7,898,658 B2 * | 3/2011 | Moskovits | G01N 21/658 356/301 |
| 8,283,750 B2 | 10/2012 | Guiraud et al. | |
| 8,912,522 B2 * | 12/2014 | Rubloff | H01G 11/86 257/14 |
| 8,993,404 B2 * | 3/2015 | Kobrinsky | H01L 28/82 438/396 |
| 9,806,024 B1 * | 10/2017 | Edelstein | H01L 21/76867 |
| 9,850,591 B2 * | 12/2017 | Sun | C25D 3/54 |
| 10,032,569 B2 * | 7/2018 | Rubloff | H01L 31/02008 |
| 10,068,184 B1 * | 9/2018 | Hertzberg | H01G 4/008 |
| 2004/0113235 A1 | 6/2004 | Coolbaugh et al. | |
| 2004/0151926 A1 * | 8/2004 | Wada | C25D 11/04 428/472 |
| 2006/0024517 A1 * | 2/2006 | Doan | C23C 16/20 428/701 |
| 2006/0189071 A1 * | 8/2006 | Grant | C23C 18/02 438/243 |
| 2007/0224399 A1 * | 9/2007 | Rabin | B82Y 30/00 428/209 |
| 2007/0289945 A1 * | 12/2007 | Hatanaka | C25D 11/045 216/102 |
| 2009/0034122 A1 * | 2/2009 | Ichihara | G11B 5/855 427/127 |
| 2009/0145769 A1 * | 6/2009 | Tsuda | C25D 11/045 205/206 |
| 2009/0229989 A1 * | 9/2009 | Urgen | C25D 1/04 977/762 |
| 2010/0159273 A1 * | 6/2010 | Filson | B32B 15/012 428/653 |
| 2010/0173478 A1 * | 7/2010 | Tombler | B82Y 10/00 438/584 |
| 2010/0219079 A1 * | 9/2010 | Routkevitch | C01B 3/503 205/175 |
| 2010/0230787 A1 | 9/2010 | Guiraud et al. | |
| 2012/0086021 A1 * | 4/2012 | Wang | G01N 21/00 257/E29.166 |
| 2012/0194813 A1 * | 8/2012 | Tzeng | G01N 21/658 977/773 |
| 2013/0192993 A1 * | 8/2013 | Mardilovich | B81C 1/00206 205/135 |
| 2014/0202868 A1 * | 7/2014 | Afzulpurkar | C25D 11/18 205/75 |
| 2014/0203400 A1 * | 7/2014 | Kobrinsky | H01L 21/0337 257/532 |
| 2014/0268491 A1 * | 9/2014 | Katkar | H01G 4/10 361/311 |
| 2015/0279724 A1 * | 10/2015 | Wu | H01L 23/5222 438/622 |
| 2015/0315715 A1 * | 11/2015 | Browning | C25D 11/24 428/102 |
| 2016/0268144 A1 * | 9/2016 | Voiron | H01L 27/0805 |
| 2017/0121837 A1 * | 5/2017 | Tatebe | C25D 11/24 |
| 2018/0269276 A1 * | 9/2018 | Lin | H01L 28/88 |
| 2018/0327926 A1 * | 11/2018 | van Hassel | C25D 11/246 |
| 2020/0161171 A1 * | 5/2020 | Colombeau | H01L 21/02057 |

OTHER PUBLICATIONS

Written Opinion of the International Searching Authority issued for PCT/EP2018/068632, dated Oct. 11, 2018.

Sang-Hyun Park et al.; "The Formation of Porous Anodic Aluminum Oxide Confined in μm-Size Contact and Trench Patterns"; Electrochemical and Solid-State Letters, vol. 9, No. 12, Dec. 2006, pp. D31-D33.

* cited by examiner

| Amplification min. | Width | | Height | | | | | | | | | |
|---|---|---|---|---|---|---|---|---|---|---|---|---|
| | | | 0.5 | 1.0 | 2.0 | 4.0 | 8.0 | 16.0 | 32.0 | 64.0 | 128.0 | 256.0 |
| | | 0.5 | 0.1 | 0.2 | 0.3 | 0.5 | 0.9 | 1.3 | 1.8 | 2.3 | 2.6 | 2.8 |
| | | 1 | 0.1 | 0.2 | 0.3 | 0.5 | 0.9 | 1.3 | 1.8 | 2.3 | 2.6 | 2.8 |
| | | 2 | 0.2 | 0.2 | 0.3 | 0.5 | 0.9 | 1.3 | 1.8 | 2.3 | 2.6 | 2.8 |
| | | 4 | 0.2 | 0.3 | 0.4 | 0.6 | 0.9 | 1.3 | 1.8 | 2.2 | 2.6 | 2.8 |
| | | 8 | 0.3 | 0.4 | 0.5 | 0.6 | 0.9 | 1.3 | 1.7 | 2.2 | 2.5 | 2.7 |
| | | 16 | 0.5 | 0.5 | 0.6 | 0.7 | 0.9 | 1.2 | 1.6 | 2.2 | 2.4 | 2.7 |
| | | 32 | 0.6 | 0.7 | 0.7 | 0.8 | 0.9 | 1.2 | 1.5 | 1.9 | 2.3 | 2.6 |
| | | 64 | 0.8 | 0.8 | 0.8 | 0.9 | 1.0 | 1.1 | 1.4 | 1.7 | 2.1 | 2.4 |
| | | 128 | 0.9 | 0.9 | 0.9 | 0.9 | 1.0 | 1.1 | 1.2 | 1.5 | 1.9 | 2.2 |
| | | 256 | 0.9 | 0.9 | 0.9 | 1.0 | 1.0 | 1.0 | 1.1 | 1.3 | 1.6 | 1.9 |

| Amplification max. | Width | | Height | | | | | | | | | |
|---|---|---|---|---|---|---|---|---|---|---|---|---|
| | | | 0.5 | 1.0 | 2.0 | 4.0 | 8.0 | 16.0 | 32.0 | 64.0 | 128.0 | 256.0 |
| | | 0.5 | 1.0 | 1.1 | 1.2 | 1.3 | 1.6 | 1.9 | 2.2 | 2.5 | 2.7 | 2.9 |
| | | 1 | 1.0 | 1.1 | 1.2 | 1.3 | 1.6 | 1.9 | 2.2 | 2.5 | 2.7 | 2.8 |
| | | 2 | 1.0 | 1.1 | 1.2 | 1.3 | 1.5 | 1.8 | 2.2 | 2.5 | 2.7 | 2.8 |
| | | 4 | 1.0 | 1.1 | 1.2 | 1.3 | 1.5 | 1.8 | 2.1 | 2.5 | 2.7 | 2.8 |
| | | 8 | 1.0 | 1.1 | 1.1 | 1.3 | 1.4 | 1.7 | 2.1 | 2.4 | 2.6 | 2.8 |
| | | 16 | 1.0 | 1.1 | 1.1 | 1.2 | 1.4 | 1.6 | 1.9 | 2.3 | 2.6 | 2.8 |
| | | 32 | 1.0 | 1.0 | 1.1 | 1.1 | 1.3 | 1.5 | 1.8 | 2.1 | 2.4 | 2.7 |
| | | 64 | 1.0 | 1.0 | 1.0 | 1.1 | 1.2 | 1.3 | 1.6 | 1.9 | 2.2 | 2.5 |
| | | 128 | 1.0 | 1.0 | 1.0 | 1.1 | 1.1 | 1.2 | 1.4 | 1.6 | 1.9 | 2.3 |
| | | 256 | 1.0 | 1.0 | 1.0 | 1.0 | 1.1 | 1.1 | 1.2 | 1.4 | 1.6 | 2.0 |

FIG. 12

| | | | W/H | | | | | | | | |
|---|---|---|---|---|---|---|---|---|---|---|---|
| | | | 0.5 | 1.0 | 2.0 | 4.0 | 8.0 | 16.0 | 32.0 | 64.0 | 128.0 | 256.0 |
| Amplification min. | Width | 0.5 | 0.1 | 0.1 | 0.3 | 0.5 | 0.8 | 1.4 | 2.2 | 3.1 | 3.8 | 4.3 |
| | | 1 | 0.1 | 0.2 | 0.3 | 0.5 | 0.8 | 1.4 | 2.2 | 3.0 | 3.8 | 4.3 |
| | | 2 | 0.1 | 0.2 | 0.3 | 0.5 | 0.8 | 1.4 | 2.2 | 3.0 | 3.7 | 4.3 |
| | | 4 | 0.2 | 0.3 | 0.4 | 0.5 | 0.9 | 1.4 | 2.1 | 2.9 | 3.7 | 4.2 |
| | | 8 | 0.3 | 0.4 | 0.4 | 0.6 | 0.9 | 1.3 | 2.0 | 2.8 | 3.6 | 4.2 |
| | | 16 | 0.5 | 0.5 | 0.6 | 0.7 | 0.9 | 1.3 | 1.8 | 2.6 | 3.4 | 4.0 |
| | | 32 | 0.6 | 0.7 | 0.7 | 0.8 | 0.9 | 1.2 | 1.6 | 2.3 | 3.0 | 3.7 |
| | | 64 | 0.8 | 0.8 | 0.8 | 0.9 | 1.0 | 1.1 | 1.4 | 1.9 | 2.6 | 3.3 |
| | | 128 | 0.9 | 0.9 | 0.9 | 0.9 | 1.0 | 1.1 | 1.3 | 1.6 | 2.1 | 2.8 |
| | | 256 | 0.9 | 0.9 | 0.9 | 1.0 | 1.0 | 1.0 | 1.1 | 1.3 | 1.6 | 1.9 |

| | | | W/H | | | | | | | | |
|---|---|---|---|---|---|---|---|---|---|---|---|
| | | | 0.5 | 1.0 | 2.0 | 4.0 | 8.0 | 16.0 | 32.0 | 64.0 | 128.0 | 256.0 |
| Amplification max. | Width | 0.5 | 1.0 | 1.1 | 1.2 | 1.4 | 1.7 | 2.1 | 2.8 | 3.4 | 4.0 | 4.4 |
| | | 1 | 1.0 | 1.1 | 1.2 | 1.3 | 1.6 | 2.1 | 2.7 | 3.4 | 4.0 | 4.4 |
| | | 2 | 1.0 | 1.1 | 1.2 | 1.3 | 1.6 | 2.1 | 2.7 | 3.4 | 4.0 | 4.4 |
| | | 4 | 1.0 | 1.1 | 1.2 | 1.3 | 1.6 | 2.0 | 2.6 | 3.3 | 3.9 | 4.4 |
| | | 8 | 1.0 | 1.1 | 1.1 | 1.3 | 1.5 | 1.9 | 2.5 | 3.1 | 3.8 | 4.3 |
| | | 16 | 1.0 | 1.1 | 1.1 | 1.2 | 1.4 | 1.7 | 2.2 | 2.9 | 3.6 | 4.1 |
| | | 32 | 1.0 | 1.0 | 1.1 | 1.1 | 1.3 | 1.5 | 1.9 | 2.5 | 3.2 | 3.8 |
| | | 64 | 1.0 | 1.0 | 1.0 | 1.1 | 1.2 | 1.3 | 1.6 | 2.1 | 2.7 | 3.4 |
| | | 128 | 1.0 | 1.0 | 1.0 | 1.1 | 1.1 | 1.2 | 1.4 | 1.7 | 2.2 | 2.9 |
| | | 256 | 1.0 | 1.0 | 1.0 | 1.0 | 1.1 | 1.1 | 1.2 | 1.4 | 1.6 | 2.0 |

SUBSTRATES EMPLOYING SURFACE-AREA AMPLIFICATION, FOR USE IN FABRICATING CAPACITIVE ELEMENTS AND OTHER DEVICES

CROSS REFERENCE TO RELATED APPLICATIONS

The present application is a continuation of application Ser. No. 16/739,397, filed Jan. 10, 2020, which is a continuation of International application No. PCT/EP2018/068632, filed Jul. 10, 2018, which claims priority to European Patent Application No. 17305897.5, filed Jul. 10, 2017, the entire contents of each of which are incorporated herein by reference.

FIELD OF THE INVENTION

The present invention relates to the field of electrical/electronic device fabrication. More particularly, the invention relates to substrates, fabrication methods and fabricated devices that employ surface area amplification techniques.

BACKGROUND OF THE INVENTION

In various applications it can be advantageous to make use of so-called "surface-area amplification" techniques, that is, techniques to increase the surface area of a surface without increasing the footprint covered by the projection of the surface onto a plane. Two examples of such applications will be described below for the purposes of illustration only; these examples are not exhaustive.

For example, in a chemical sensor a particular chemical species may be detected by virtue of the adsorption of molecules of this chemical species on the surface of a layer of sensing material (e.g. a metal oxide layer). By increasing the surface area of the layer of sensing material it may be possible to improve the sensitivity and/or detection speed of the sensor. A surface-area amplification technique in this case may involve forming the sensing layer by depositing the sensor material on a substrate that has a textured surface, that is, a surface that has relief features (e.g. projections or pillars and/or depressions or trenches, recalling that in this field a "trench" need not be an elongated hole but may, for example, be a hole having the same length and breadth dimensions, such as a hole having a square or circular cross-section, as can be seen in the appended figures).

As another example, it is known to form three-dimensional capacitors by depositing alternate electrically-conductive, electrically-insulating and electrically-conductive materials on a textured substrate surface, i.e. on a substrate surface that includes trenches extending generally in the thickness direction of the substrate and/or on a substrate surface which has pillar-type structures rising from it. The surface area of the electrode layers and dielectric layers may be amplified, and thus the capacitance density may be increased, by increasing the aspect ratio of the texture features upon which the electrode layers and dielectric layers are formed: for example, by making the trenches deeper, and/or by making the trenches narrower so that a greater number of trenches can be provided for a given footprint.

SUMMARY OF THE INVENTION

However, problems can arise when efforts are made to increase the degree of surface-area amplification using the above-described techniques.

Considering the example of 3D capacitors, it may be desired to deposit the functional layers (e.g. metal-insulator-metal layers) on a substrate having trenches that are 1-30 µm deep but only 30-100 nm wide. In this confined geometry it is difficult to deposit materials on the trench surfaces. Conventionally, techniques such as chemical vapor deposition (CVD) or atomic layer deposition (ALD) could be employed in order to introduce a precursor into the trenches so that the precursor species can react with the trench wall material and form a desired layer of metal (or insulator). However, in extremely confined spaces, such as trenches having large aspect ratio, the diffusion rate of the precursor species is limited and/or uneven and this may lead to one or more of the following problems:

a very slow deposition rate
a poorly conformal deposition, resulting in variation in film thickness or film material properties,
high processing costs.

A technique that has been employed in order to form a template for use in forming 3D capacitors involves using anodization to create a textured substrate surface (upon which the electrode layers and dielectric layers of the capacitor are subsequently deposited). For example, an aluminum layer may be formed on a silicon substrate and then an anodization process may be performed to create a high density of uniform, self-assembled trenches, or "pores", in the aluminum layer. Strictly speaking the pores are defined in an aluminum oxide layer that forms during the anodization process; hence the pores are said to be formed in AAO—anodic aluminum oxide. In some cases the oxide layer at the bottoms of the pores is removed so that the interior of each pore can be brought into communication with an electrically conductive layer provided at the side of the template remote from the mouths of the pores.

Figure 1:
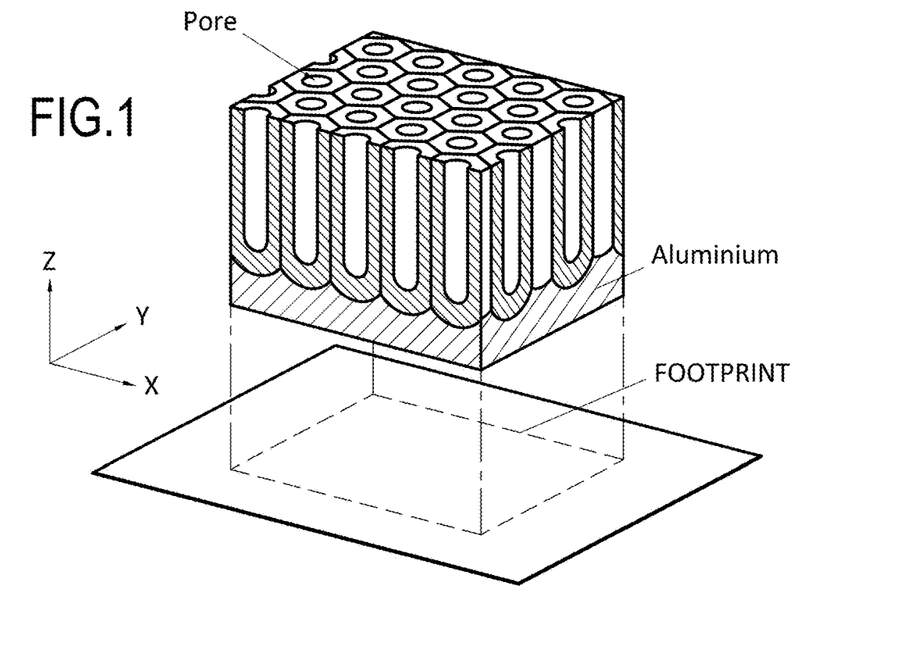
FIG. 1 is a diagram to illustrate surface-area amplification.

FIG. 1 illustrates a template of the above-described kind formed by anodization and shows that the footprint of this template (i.e. the surface area occupied by a projection of the template onto a plane) is much smaller than the surface area provided by the internal surfaces of the pores, in combination with the surfaces of the lands between the pores, in the template.

Although it may be beneficial, in view of improving capacitance density, to use anodization to form a template for production of 3D capacitors, the pore depths in AAO that are produced using the above-described technique are usually no greater than 10 µm because, in general, the layer of the metal to be anodized has limited thickness. Difficulties arise if an attempt is made to form the layer of aluminum (or other metal for anodization) to a thickness greater than 10 or 15 µm. Typically the metal for anodization is deposited by a CVD or physical vapor deposition (PVD) process, and attempting to deposit a layer thicker than 10-15 µm or so may result in one or more of the following problems:

excessively long process time (leading to loss of productivity)
requirement for more frequent cleaning of fabrication equipment (and, thus, higher maintenance costs),
poor control of the film micro-structure (overheating, re-organization).

Nevertheless, there is a desire to be able to increase the degree of surface amplification that can be achieved.

The present invention has been made in the light of the above problems.

The present invention provides a substrate comprising a base layer having a first principal surface comprising a plurality of first trenches and intervening first lands, characterized by a cover layer of thickness greater than 5 µm provided on said first principal surface of the base layer and covering the first trenches and first lands substantially conformally, wherein:

the surface of the cover layer remote from the first principal surface of the base layer comprises a plurality of second trenches and intervening second lands defined at a smaller scale than the first trenches and first lands, the thickness of the first lands is greater than 1 µm, and a ratio R=D/H is greater than 0.5 where D is the size of the free space between the surfaces of the cover layer (12) covering two adjacent first lands (4) and H is the height of the first lands.

As stated in the preceding paragraph, and as can be seen in the appended figures (notably FIG. 5A), the cover layer covers the first trenches and first lands conformally, i.e. the cover layer follows the contours of the underlying first principal surface of the substrate, and along its length the cover layer has substantially constant thickness. Thus, on a macro scale, the texture of the first principal surface is reproduced by the perimeter of the cover layer. However, the perimeter of the cover layer is itself textured at a smaller order of magnitude; in other words, the second trenches and second lands are provided in the cover layer in parts of the cover layer which overlie the first trenches, in parts of the cover layer which are formed on the side walls of the first trenches and in parts of the cover layer which overlie the first lands in the first principal surface of the substrate.

With current fabrication processes it is unlikely to achieve perfect conformity of the cover layer with the contours of the texture of the base layer. However, in substrates according embodiment of the invention a high degree of conformality is provided, preferably achieving a conformality ratio of 70% or more. The conformality ratio indicates the uniformity of the thickness of the cover layer all along the texture of the base layer. In cases where the conformality is ideal the cover layer exactly follows the contours in the base layer's surface. Various approaches may be used to quantify the conformality ratio. For example, where ThicknessMax is the maximum thickness of the cover layer, ThicknessMin is the minimum thickness of the cover layer and ThicknessAvg is the average thickness of the cover layer, the conformality ratio may be defined as (ThicknessMax−ThicknessMin)/ThicknessAvg.

The above-described substrate makes use of a multi-order surface-area amplification technique in which a cover layer having a textured surface whose texture features are at a first, relatively small scale, is provided conformally over a base layer surface which is itself also textured and has texture features on a second, relatively larger scale.

In effect this technique combines two orders of texturing to enhance the overall surface area provided by the substrate: a first order of texturing is provided by the first trenches and first lands in the first principal surface of the base layer, and a second order of texturing is provided by the second trenches and second lands in the surface of the cover layer that faces away from the first principal surface of the base layer.

By providing the textured cover layer on a base layer which itself has appropriate, larger-scale texture features the overall surface area provided by the substrate can be increased compared to a case where the textured cover layer is provided on a flat base, without increasing the footprint of the substrate.

Compared to a substrate in which a textured cover layer is provided on a flat (untextured) base layer, the above-described substrate according to the invention can incorporate second trenches having a lower aspect ratio and yet achieve the same (or increased) overall surface area. A lower aspect ratio facilitates circulation of gaseous or liquid materials within the second trenches and may increase the speed and/or uniformity of deposition of material layers on the walls of the second trenches.

Compared to a substrate in which a textured cover layer is provided on a flat (untextured) base layer, the above-described substrate according to the invention can incorporate a thinner cover layer and yet achieve the same (or increased) overall surface area. In a case where the cover layer is thinner, for example 10 µm or less, it may be possible to improve the control of the micro-structure of the cover layer. Further, in a case where the cover layer is thinner, for example 10 µm or less, the process time required for production of the cover layer may be reduced to a practical time period and/or the requirement for cleaning of the fabrication equipment may be reduced to an acceptable level, allowing maintenance costs to be reduced.

The thickness of the cover layer is greater than 5 µm, the width of the first lands is greater than 1 µm, and the ratio R is greater than 0.5. By setting the width of the first lands greater than 1 µm the physical integrity of the first lands is promoted during the process of fabricating the substrate, thus reducing the risk of breakage or shape distortion. By setting the thickness of the cover layer greater than 5 µm a substantial degree of surface amplification may be obtained. By setting the ratio R greater than 0.5 the ability to form the cover layer in conformity with the shape of the underlying first lands and first trenches is promoted. Respecting this combination of features may provide better uniformity in the capacitive elements and reduce the risk of defects, thus producing an enhancement in the yield of the substrate's fabrication process.

In certain embodiments of the invention the ratio R=D/H is in the range 0.5 to 3.0, where D is the gap between two adjacent first lands covered by the cover layer and H is the height of the first lands. In the case where the ratio R is in the range 0.5 to 3.0 conformity of the cover layer to the contours of the underlying first trenches and first lands is promoted and a non-negligible improvement in surface-area amplification factor may be achieved.

In certain embodiments of the invention the first trenches have sidewalls that are perpendicular to the first principal surface of the base layer or extend at an angle of less than 90° to the first principal surface. In other words, the first lands which provide the texturing of the base layer may have various cross-sectional shapes varying from almost flat, through trapezoidal, to rectangular (with the cross-section taken in any plane perpendicular to the wafer surface).

The first trenches may interconnect and form a continuous contour that intersects with itself. In this manner a continuous flow path is formed and this may improve the speed and uniformity of diffusion of gaseous or liquid materials within the first trenches, for example during deposition of cover layer material on the first principal surface of the base layer.

The cover layer may be an anodized layer, for example an anodic aluminum oxide layer, and the second trenches may be pores in the anodized layer. In this case the pores in the anodized layer are liable to be nanometric in scale and this produces a significant increase in the surface area provided by the substrate. The first trenches and first lands in the first principal surface of the base layer may be micrometric in scale, enabling simpler fabrication processes to be used to texture the first principal surface of the base layer.

The cover layer may be electrically insulating and a stack of three thin film layers may be provided over, and conformally cover, the second trenches and second lands. The first layer of the stack may be electrically conductive, the second layer of the stack electrically insulating and the third layer of the stack electrically conductive. The stack of three films may thus form a capacitive structure having high capacitance density.

In a different case, the cover layer may be electrically conductive and a first thin film layer may be provided over, and conformally cover, the second trenches and second lands of the cover layer, the first thin film layer being electrically insulating or electrically conductive. Such a structure may be used, inter alia, to form a chemical sensing element having a large sensing area. Alternatively, in a case where the first thin film layer is electrically insulating and a second thin film layer is provided over, and conformally covers, the first thin film layer, this second thin film layer being electrically conductive, the layered configuration may form a capacitive structure having high capacitance density.

The present invention further provides a capacitive element employing a capacitive structure as described above. The capacitive element may have high capacitance density.

The present invention still further provides a System in Package module comprising a substrate or capacitive element as described above, integrated with an integrated circuit. Such a System in Package module benefits from the improved properties of the substrate as described above.

The present invention yet further provides a chemical sensor element as described above, in which the first thin film layer is a chemical sensing layer adapted to adsorb selected molecules. By virtue of the increased surface area of the sensing layer the reaction speed and/or sensitivity of the chemical sensor element may be improved.

The present invention still further provides a method of fabricating a substrate, comprising:

forming a base layer having a first principal surface defining a plurality of first trenches and intervening first lands, and forming a cover layer over said first principal surface of the base layer to conformally cover the first trenches and first lands, the surface of the cover layer remote from the first principal surface of the base layer comprising a plurality of second trenches and intervening second lands defined at a smaller scale than the first trenches and first lands.

By fabricating a substrate according to the above method the surface area provided by the substrate is amplified without needing to increase the aspect ratio of the second trenches.

Different approaches may be used to provide the texture in the first principal surface of the base layer. According to a subtractive approach the base layer is a monolithic layer and the texture in the first principal surface is created by etching this monolithic layer. Only a small number of process steps are required for the subtractive approach. According to an alternative, additive approach, the base layer is formed by providing a first sub-base-layer which has an untextured (flat) surface and forming, on that flat surface, a second sub-base layer which consists of projections that constitute the first lands. The additive approach enables different materials to be used for the first sub-base layer and second sub-base layer, which increases design freedom.

BRIEF DESCRIPTION OF THE DRAWINGS

Further features and advantages of the present invention will become apparent from the following description of certain embodiments thereof, given by way of illustration only, not limitation, with reference to the accompanying drawings in which:

FIGS. 3A and 3B illustrate different patterns of texturing a base layer in substrates according to the embodiment of FIG. 2, in which:

DETAILED DESCRIPTION OF THE PREFERRED EMBODIMENTS

A substrate 1 according to an embodiment of the invention will now be described with reference to FIGS. 2 to 5B.

The substrate 1 according to the embodiment of FIGS. 2 to 5B comprises a base layer 2 whose first principal surface 2A has texture features consisting of first trenches 3 and first lands 4. The first trenches 3 and first lands 4 are relatively large scale texture features. In the description below it shall be assumed that the texture features in the first principal surface of the base layer 2 are micrometric features, i.e. trenches and lands having dimensions of the order of micrometers. However, the invention is not limited to the case where the relatively large-scale texture features in the base layer 2 are micrometric.

Figure 3A:
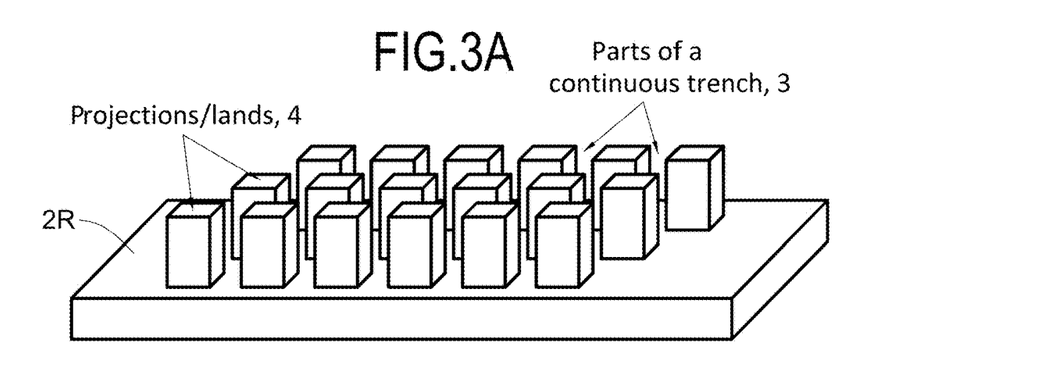
FIG. 3A illustrates a texturing pattern in which a continuous trench surrounds projections/pillars rising from a root surface of the base layer.

The pattern of the texture features in the base layer 2 is not particularly limited. According to a first patterning approach, illustrated in FIG. 3A, the texture features consist of first lands 4 in the form of projections (or pillars) rising from a root level 2R of the base layer, and the spaces between the projections correspond to a continuous trench 3. The first lands 4 may be equidistant from one another but this is not a requirement. The first lands 4 may be arranged at lattice points, for example on a hexagonal or cubic lattice, but this is not a requirement. When there is regularity in the pattern of the texture features (e.g. constant trench width and shape)

then fabrication is simplified because, for example, layout and process control are made easier. For example, in the case where the lands 4 are equidistant and set on a regular lattice, the trench (corresponding to the space in between the first lands 4) has a more even width/depth, thus facilitating the circulation of gas (etchant or deposition precursor) during the fabrication process.

In the case illustrated in FIG. 3A the projections constituting the first lands 4 may be formed in various shapes. The following is a non-exhaustive list of some example shapes for the first lands 4: cylindrical, parallelopipedal, pyramidal, tetragonal, or having a cross-sectional shape (in the plane parallel to the first principal surface 2a) in the form of a cross, a tripod or any other rotationally-symmetric shape. Moreover, it is not essential for the first lands 4 to have a rotationally-symmetrical shape; the texture may, for example, comprise simple parallel linear trenches separated by linear walls. In implementations using parallel linear trenches separated by linear walls, the circulation of gas (etchant, or deposition precursor) during fabrication processes is facilitated in the case where the trenches intersect to form a continuous trench.

The first trenches 3 have sidewalls 3s which may extend at an angle of less than or equal to 90° relative to the first principal surface 2A of the base layer. With sidewalls angled in this manner the first lands 4 have constant cross-section, or may taper somewhat, as they extend away from the root level 2R of the base layer 2. This type of shape facilitates creation of a conformal layer when cover layer material (describe below) is deposited over the first lands 4 and first trenches 3, and good conformality serves to promote uniformity of porosity that is created in the cover layer.

Figure 3B:
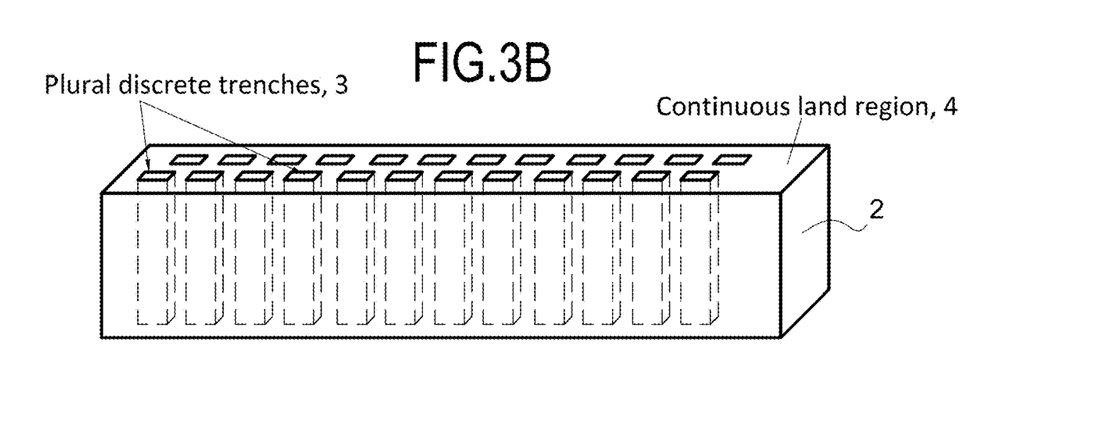
FIG. 3B illustrates a texturing pattern in which discrete trenches are formed in a continuous land region.

According to a second patterning approach, illustrated in FIG. 3B, the texture features consist of a continuous land region 4 having multiple discrete trenches descending into the thickness direction of the base layer 2. It should be mentioned that FIG. 3B is highly schematic and, in practice, the mouths of the first trenches 3 would open out to a greater extent than is illustrated (in order to promote conformal deposition of the cover later described below). The shape and spacing of the discrete trenches is not particularly limited. However, when the cross-sectional area of the trenches is substantially constant along the length of the trenches this helps to promote conformality in a cover layer deposited over the land region 4 and discrete trenches.

The patterning approach illustrated by FIG. 3A makes use of a continuous trench and, compared to the FIG. 3B case where discontinuous trenches are involved, has an advantage in terms of improved gas circulation during the etching process and improved conformality of a cover layer deposited over the first lands 4 and first trenches.

Figure 2:
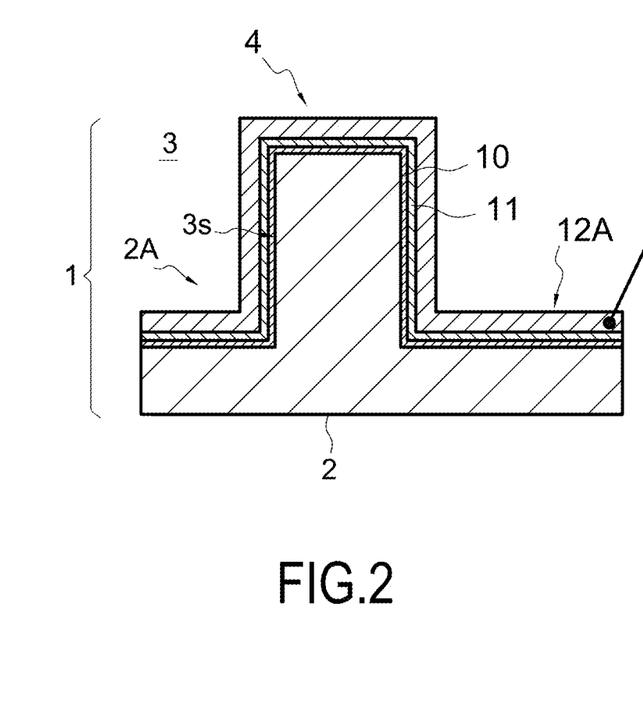
FIG. 2 is a diagram schematically representing a cross-section through a portion of a substrate according to an embodiment of the invention.
Figure 4A:
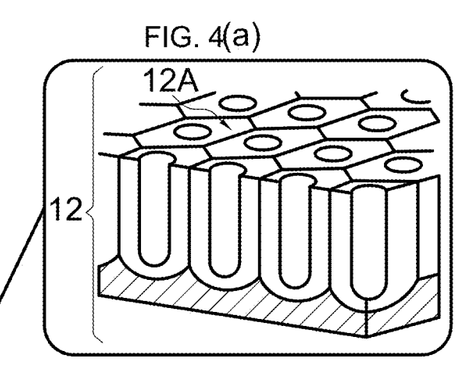
FIG. 4(a) to FIG. 4(d) shows magnified views of part of a cover layer in the embodiment of FIG. 2.
Figure 4B:
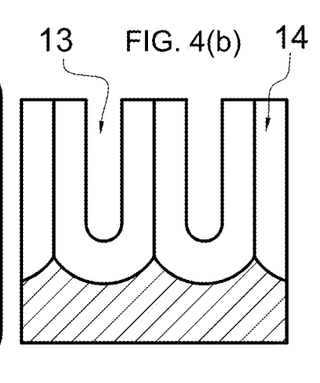
Figure 4C:
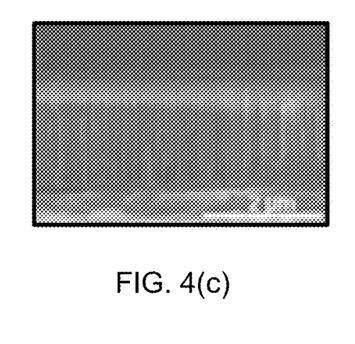
Figure 4D:
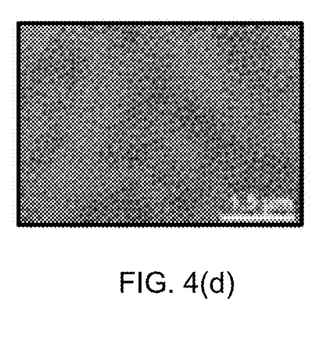

FIG. 2 is a diagram schematically representing a cross-section through a portion of a substrate according to an embodiment of the invention. As can be seen in FIG. 2, a cover layer 12 is formed over the first principal surface 2a of the base layer 2 and conformally covers the first trenches 3 and first lands 4. FIGS. 4(a) to 4(d) show magnified views of a portion of the cover layer 12 so that structure of this cover layer 12 can be understood. FIG. 4(a) is a diagram representing a perspective view whereas FIG. 4(b) is a diagram representing a cross-sectional view. FIG. 4(c) is a TEM high-resolution image of the cover layer 12 viewed from the side and FIG. 4(d) is an image of the cover layer 12 viewed from above.

Texture features consisting of second trenches 13 and second lands 14 are formed in a surface 12A of the cover layer 12 that is remote from the base layer 2. The second trenches 13 and second lands 14 are relatively small scale texture features, that is, they are at a smaller scale than the texture features in the base layer 2. In other words the dimensions of the texture features in the cover layer 12 (i.e. the diameter of the second trenches 13 and the pitch of the second trenches 13) are smaller than the dimensions of the texture features in the base layer 2.

In the description below it shall be assumed that the texture features in the surface 12A of the cover layer 12 that is remote from the base layer are nanometric features, i.e. trenches and lands having dimensions of the order of nanometers, for example pores formed in AAO. However, the invention is not limited to the case where the relatively small-scale texture features in the cover layer 12 are nanometric. Nevertheless, it is preferred for the texture features in the surface 12A of the cover layer 12 to be sub-micrometric and more preferred for them to be nanometric. Likewise the invention is not limited to the case where the second trenches are formed by an anodization process, other processes could be used (e.g. anisotropic etching).

Although problems may arise, as described above, if the thickness of the material that is anodized to form the cover layer 12 is made greater than about 10 or 15 µm, it is undesirable to form the pre-anodization material layer excessively thin because this restricts the overall surface area that can be obtained in the finished structure. For certain applications it is advantageous to set the thickness of the cover layer 12 to more than 5 µm so that a substantial surface area is obtained when fabrication of the multi-order textured substrate is complete.

The texture features in the base layer 2 may be produced using a subtractive process as shall be described with reference to FIG. 5A. More particularly, according to the present subtractive approach the texture features are formed in a monolithic base layer 2, for example by etching the base layer using lithographic techniques to achieve the desired patterning of the first lands 4 and first trenches 3. In this case the base layer 2 is "monolithic" insofar as a common layer forms the first lands and forms a root portion from which the lands extend, but this does not exclude the possibility that one or more additional layers may be laminated on the base layer 2.

Alternatively, the texture features in the base layer 2 may be produced using an additive process as shall be described with reference to FIG. 5B. More particularly, according to the present additive approach a base layer 2 having the desired texture features is produced using a first sub-base layer 2a having a substantially planar shape (or, at least a substantially flat, untextured surface) upon which a second sub-base layer 2b is formed. Portions of the second sub-base layer 2b form the first lands 4. The second sub-base layer 2b may, for example, be deposited on the first sub-base layer 2a as a continuous layer and then etched to leave behind the first lands 4. Although FIG. 5B illustrates a case where there are two sub-base layers 2a, 2b it is to be understood that the desired relatively large-scale texture may be produced using three or more than three sub-base layers.

Figure 5A:
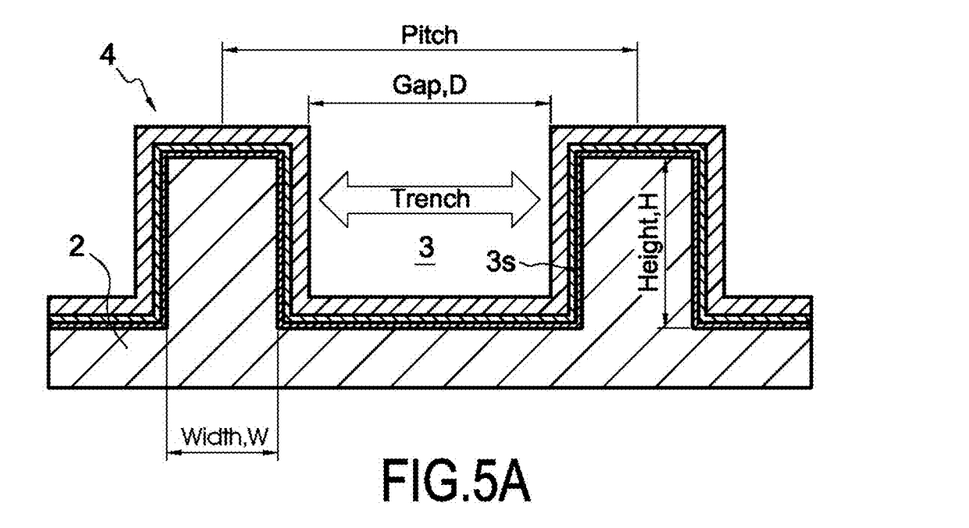
FIG. 5A is a diagram schematically representing a cross-section through a portion of a substrate according to an embodiment of the invention that uses a monolithic base layer.
Figure 5B:
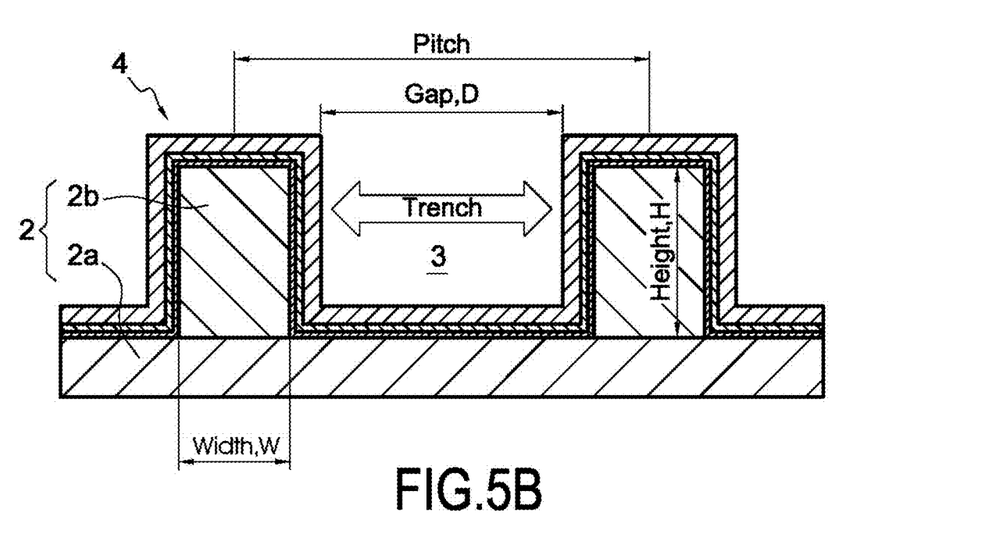
FIG. 5B is a diagram schematically representing a cross-section through a portion of a substrate according to an embodiment of the invention that uses a base layer including first and second sub-base-layers.

In the embodiment illustrated in FIGS. 2, 5A and 5B, additional layers 10 and 11 are interposed between the base layer 2 and the cover layer 12. The additional layer 10 is a metal layer that may be used to promote adhesion between the base layer 2 and the material of the cover layer 12. This metal layer 10 may also serve for implementing electrical interconnection. Various materials may be used for the metal layer 10 including, but not limited to aluminum, titanium or copper.

The additional layer 11 is an anodization stop layer that serves to control the depth of the pores formed in the cover layer 12 in the present example embodiment in which the second trenches 13 are formed in the cover layer during an anodization process. Various materials may be used for the anodization stop layer including, but not limited to: titanium or tungsten. Further information regarding the anodization stop layer 11 is given below in relation to a fabrication method described with reference to FIG. 10.

Different layers (or extra layers) compared to layers 10, 11 may be interposed between the base layer 2 and the cover layer 12 depending on the materials used to form the base layer 2 and cover layer 12 and/or depending on the fabrication techniques used to form the cover layer 12. Likewise, the layers 10 and 11 may be omitted in suitable cases.

Simulations have been performed to evaluate how dimensions of the texture features of the base layer 2 affect the degree of surface-area amplification that may be achieved.

Figure 11:
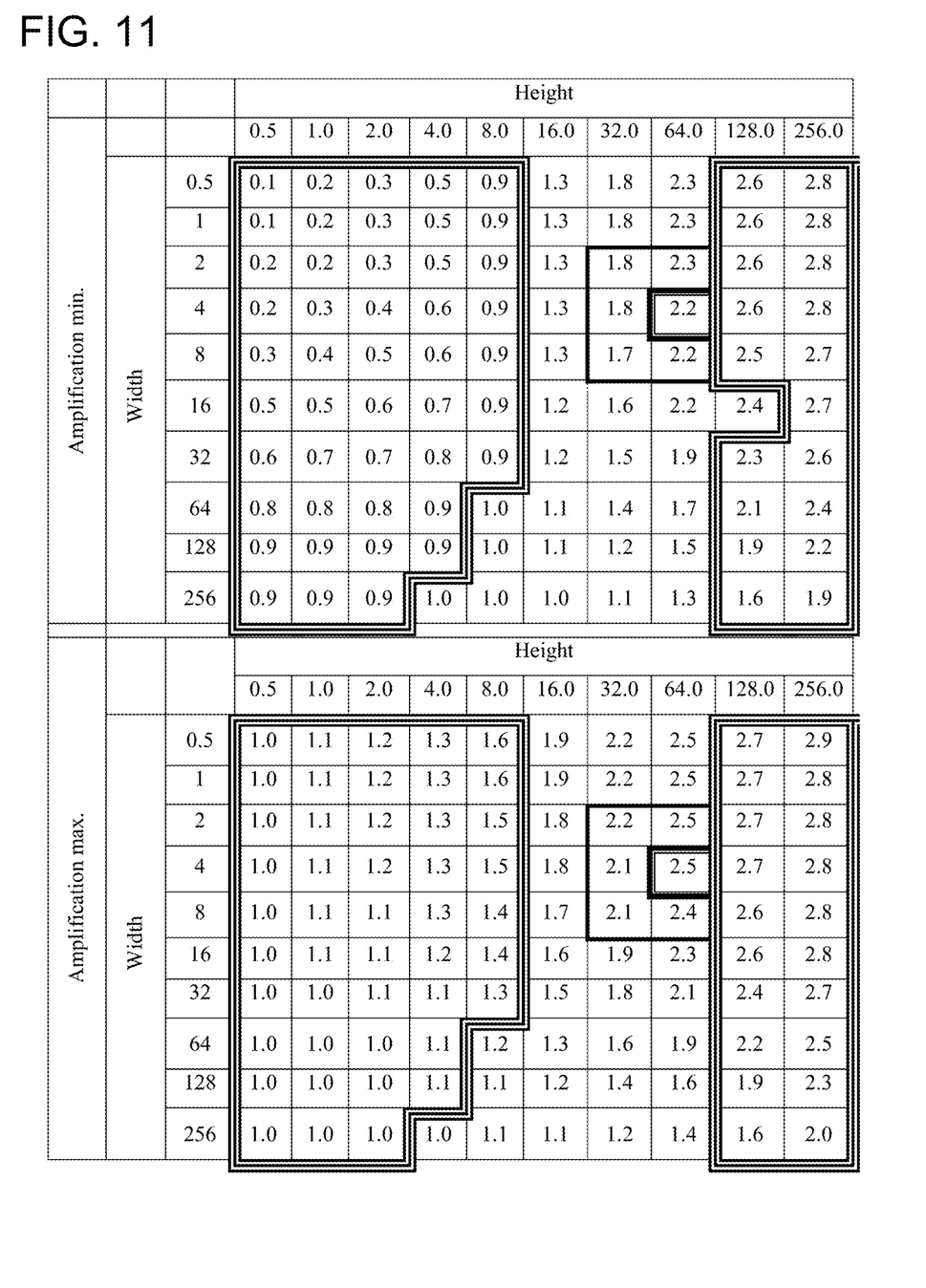
FIG. 11 is a table showing the results of a first set of simulations.

A first set of simulations computed the surface-area amplification ratios that could be achieved in the case where a 10 μm thick AAO cover layer is formed on a textured base layer 2, a ratio R=D/H takes a value of 1 (where D is the size of the free space between the opposed surfaces of the cover layer 12 that covers two adjacent first lands 4, and H is the height of the first lands 4) and different values were used a) for the height H of the first lands (or depth of the first trenches), and b) for the width W of the first lands 4 (or the gap between adjacent trenches).

FIG. 11 shows the results of this first set of simulations and includes surface-area amplification values "Amplification max" determined according to an optimistic computation formula which maximizes likely surface-area amplification as well as surface-area amplification values according to an "optimistic" computation formula which maximizes the surface-area amplification ratio as well as surface-area amplification values "Amplification min" determined according to a pessimistic computation formula which minimizes likely surface-area amplification ratio. NB the height and width values included in FIG. 11 are expressed in micrometers.

In FIG. 11, the cells that are NOT within the triple bold outlined areas correspond to combinations of width and height values that give significant improvement in term of surface amplification and that provide base layer geometries that are more realistic from a processing and/or robustness point of view. Therefore they correspond to combinations of width and height values that are preferred in the case where a 10 μm thick AAO cover layer is formed on the textured base layer 2, and ratio R=D/H takes a value of 1.

In FIG. 11, a single bold outline surrounds a group of six cells that correspond to combinations of width and height values that yield particularly significant benefit in term of surface amplification and provide base layer geometries that are realistic from a process and robustness point of view. Therefore they correspond to the more preferred range of setup for the width and height parameters in the case where a 10 μm thick AAO cover layer is formed on the textured base layer 2, and ratio R=D/H takes a value of 1.

In FIG. 11, a double bold outline surrounds a single cell that corresponds to a combination of width and height values that provides the maximum amplification for an acceptable Height/Width ratio that is realistic from a process and robustness point of view. Therefore it corresponds to the setup that is currently considered to be optimal for the process in the case where a 10 μm thick AAO cover layer is formed on the textured base layer 2, and ratio R=D/H takes a value of 1.

Figure 12:
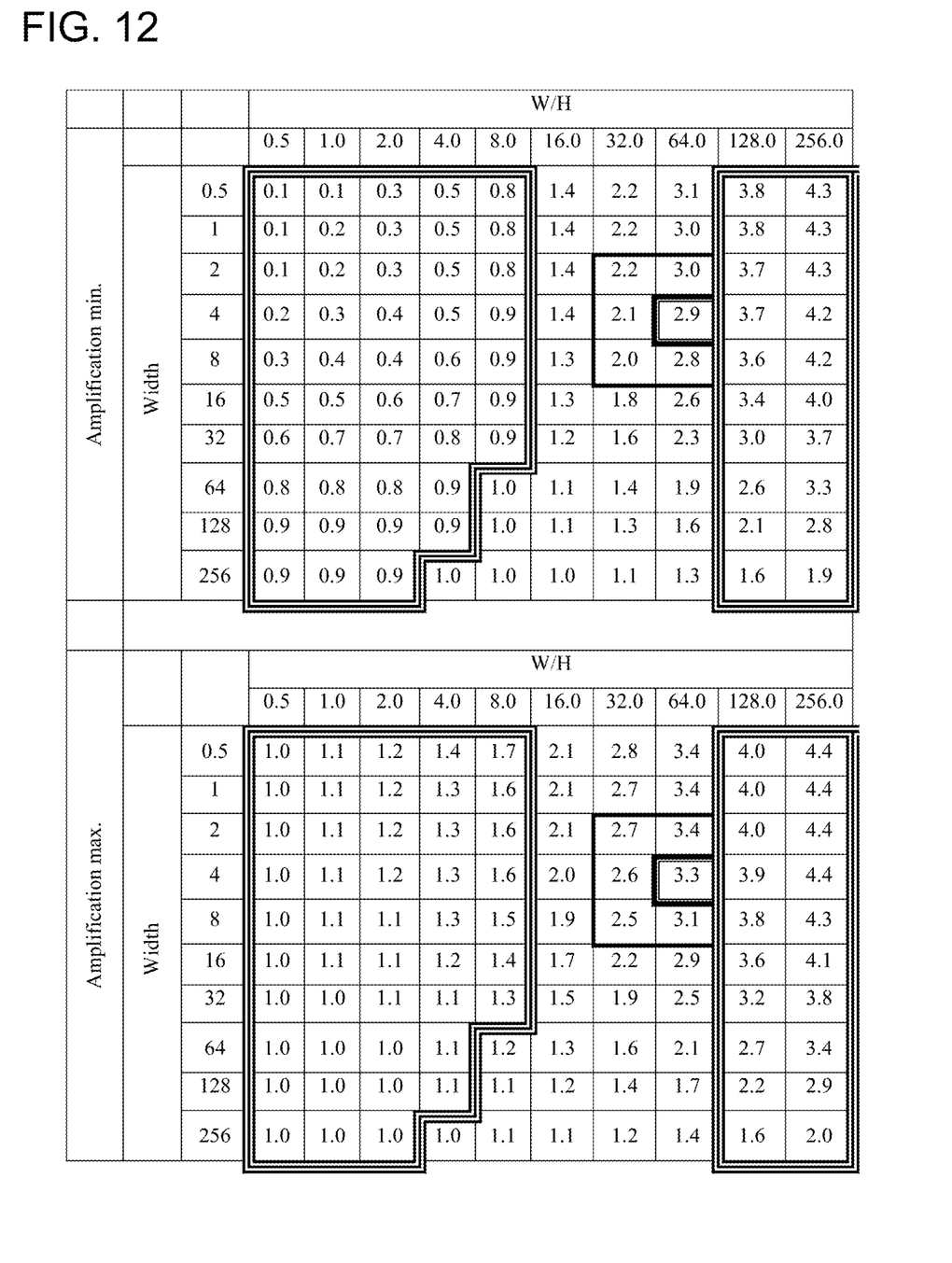
FIG. 12 is a table showing the results of a second set of simulations.

A second set of simulations computed the surface-area amplification ratios that could be achieved in the case where a 10 μm thick AAO cover layer is formed on a textured base layer 2, the ratio R=D/H takes a value of 0.5, and different values were used a) for the height H of the first lands (or depth of the first trenches), and b) for the width W of the first lands 4.

FIG. 12 shows the results of this second set of simulations and, as in FIG. 11, shows "Amplification max" and "Amplification min" values determined according to the optimistic and pessimistic computation formulae, respectively. As in FIG. 11, in FIG. 12 the height and width values are expressed in micrometers.

In FIG. 12 the cells that are NOT within the triple bold outlined areas correspond to combinations of width and height values that give significant improvement in term of surface amplification and that provide base layer geometries that are more realistic from a processing and/or robustness point of view. Therefore they correspond to combinations of width and height values that are preferred in the case where a 10 μm thick AAO cover layer is formed on textured base layer 2, and the ratio R=D/H takes a value of 0.5.

In FIG. 12 a single bold outline surrounds a group of six cells that correspond to combinations of width and height values that yield particularly significant benefit in term of surface amplification and provide base layer geometries that are realistic from a process and robustness point of view. Therefore they correspond to the more preferred range of setup for the width and height parameters in the case where a 10 μm thick AAO cover layer is formed on textured base layer 2, and the ratio R=D/H takes a value of 0.5.

In FIG. 12 a double bold outline surrounds a single cell that corresponds to a combination of width and height values that provides the maximum amplification for an acceptable Height/Width ratio that is realistic from a process and robustness point of view. Therefore it corresponds to the setup that is currently considered to be optimal for the process in the case where a 10 μm thick AAO cover layer is formed on textured base layer 2, and the ratio R=D/H takes a value of 0.5.

It can be seen from FIGS. 11 and 12 that, considering the optimistic computation, surface-area amplification ratios of 1.0 or better may be obtained by setting the height of the first lands 4 to at least 1 μm.

It can be seen from FIGS. 11 and 12 that, taking both the optimistic and the pessimistic computations into account, surface-area amplification ratios of 1.0 or better may be obtained by setting the width of the first lands 4 in the range 0.5-256 μm and setting the height of the first lands 4 in the range 0.5-256 μm. The mechanical strength of the structure improves when the width of the first lands is more than 1 μm. A good compromise between improved surface-area amplification ratios and structure mechanical robustness may be obtained by setting the width of the first lands 4 in the range 2-8 μm and setting the height of the first lands 4 in the range 16.0-64.0 μm.

In certain embodiments of the invention the thickness of the cover layer is greater than 5 μm, the width of the first lands is greater than 1 μm, and the ratio R is greater than 0.5. By respecting this combination of ranges the yield of the fabrication process producing the multi-order textured substrate is enhanced.

In certain embodiments of the invention the ratio R=D/H is set in the range 0.5 to 3.0. In the case where the ratio R is set to 0.5 or more the ability to form the cover layer in conformity with the shape of the underlying first lands and first trenches is promoted. In the case where the ratio R is above 3.0 the gain in surface-area amplification becomes negligible.

A multi-order textured substrate according to embodiments of the present invention may be used to make various electrical/electronic elements. In general, the processes for making such elements involve functionalizing the surface 12A of the cover layer 12, that is, forming one or more layers that on the surface 12A.

Figure 6:
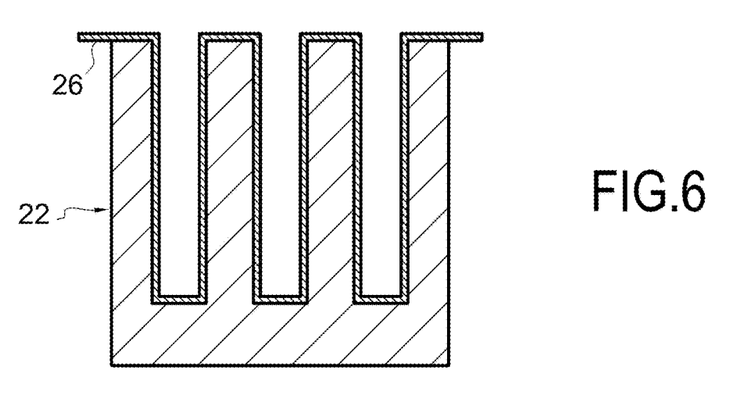
FIG. 6 is a diagram schematically illustrating a functional layer formed on a cover layer of a substrate according to an embodiment of the invention.
Figure 7:
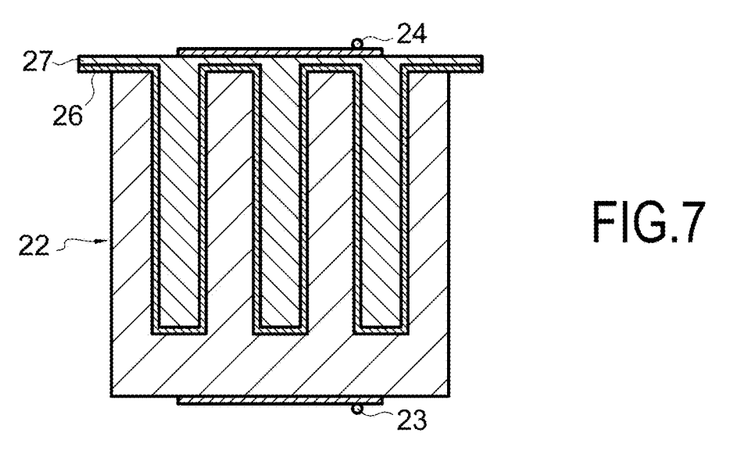
FIG. 7 is a diagram schematically illustrating a capacitive structure according to an embodiment of the invention.
Figure 8:
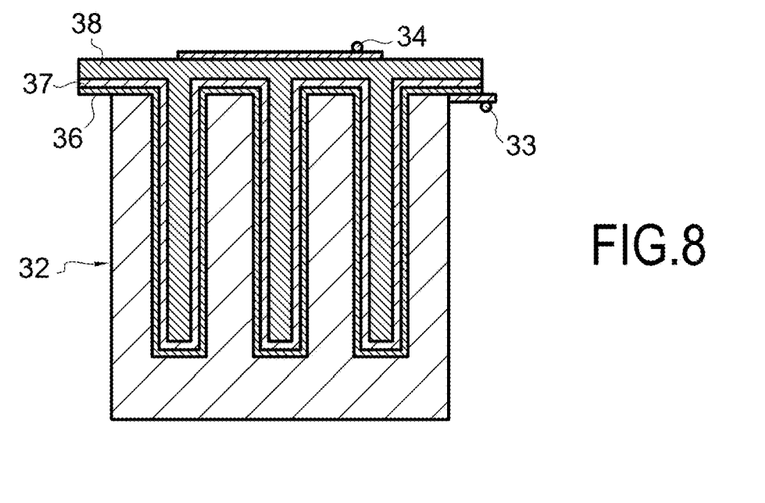
FIG. 8 is a diagram schematically illustrating a capacitive structure according to an embodiment of the invention.

FIG. 6 illustrates a first structure that may be produced by providing a thin film layer 26 on the surface of a cover layer 22 that is remote from the base layer. FIGS. 6-8 illustrate in simplified form only a portion of the cover layer, the base layer 2 is not represented. In this example the cover layer 22 is electrically conductive and the thin film layer 26 is provided over, and conformally covers, the second trenches and second lands of the cover layer 22. Depending on the target application the thin film layer 26 may be electrically insulating or electrically conductive and the material for the thin film layer 26 (and its thickness) may be selected accordingly. The thin film layer 26 may be formed on the cover layer 22 by a process appropriate to the materials of the cover layer and thin film layer and the dimensions of the second trenches. For example, ALD may be used.

The structure of FIG. 6 may be used, for example, to form a chemical sensing element. In such a case the thin film layer 26 may be formed of a material upon which molecules of a target chemical species become adsorbed.

FIG. 7 illustrates a second structure that may be produced by providing thin film layers 26 and 27 on the surface of a cover layer 22 that is remote from the base layer. In this example the cover layer 22 is electrically conductive and the thin film layers 26 and 27 are provided over, and conformally cover, the second trenches and second lands of the cover layer 22. In this example the thin film layer 26 is electrically insulating and the thin film layer 27 is electrically conductive. In this way a 3D capacitive structure is formed. A terminal 23 may be provided connecting to a bottom electrode of the capacitive structure. Although FIG. 7 represents the terminal 23 as if it were physically in contact with the cover layer 22, in practice the terminal 23 is attached to the base layer and connects electrically to the bottom electrode of the capacitive structure. A terminal 24 may be provided connecting to a top electrode in the capacitive structure. The materials for the thin film layers 26, 27, and the thickness of these layers, may be selected according to the desired capacitance of the capacitive structure. The thin film layers 26 and 27 may be formed on the cover layer 22 by processes appropriate to the materials of the cover layer and thin film layers and the dimensions of the second trenches. For example, ALD may be used.

FIG. 8 illustrates a third structure that may be produced by providing a stack of three thin film layers 36, 37 and 38 on the surface of a cover layer 32 that is remote from the base layer. In this example the cover layer 32 is electrically insulative and the stack of thin film layers 36, 37, 38 are provided over, and conformally cover, the second trenches and second lands of the cover layer 32. In this example the thin film layer 36 is electrically conductive, the thin film layer 37 is electrically insulative (i.e. a dielectric), and the thin film layer 38 is electrically conductive. In this way a 3D capacitive structure is formed in which the conductive layer 36 is a bottom electrode, the insulative layer 37 is a dielectric and the conductive layer 38 is a top electrode.

In a variant of the FIG. 8 structure, an electrical contact can be made at the bottom of the pore, by selectively dissolving oxide formed on an anodization stop layer, such that the conductive layer 36 contacts a metal layer underlying the anodization stop layer.

A terminal 33 may be provided connecting to a bottom electrode of the capacitive structure Although FIG. 8 represents the terminal 33 as if it were physically in contact with the bottom electrode/conductive layer 38, in practice the terminal 33 may be attached to the base layer and connect electrically to the bottom electrode of the capacitive structure. A terminal 34 may be provided connecting to a top electrode in the capacitive structure. The materials for the thin film layers 36, 37, and 38, as well as the thickness of these layers, may be selected according to the desired capacitance of the capacitive structure. The thin film layers 36, 37 and 38 may be formed on the cover layer 32 by processes appropriate to the materials of the cover layer and thin film layers and the dimensions of the second trenches. For example, ALD may be used.

Figure 9:
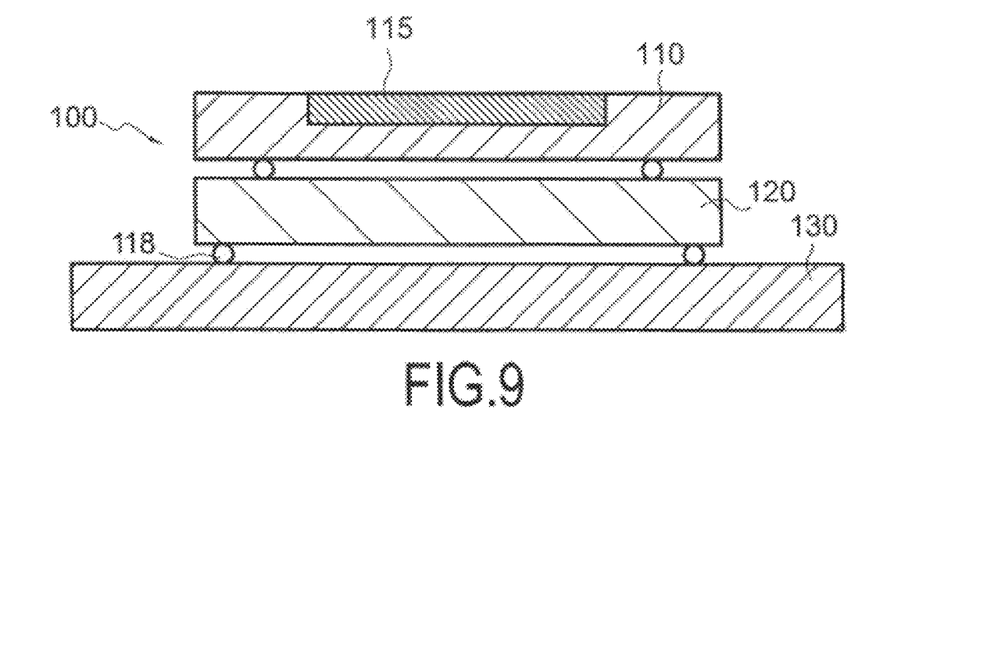
FIG. 9 is a diagram schematically illustrating a System in Package module according to an embodiment of the invention.

FIG. 9 illustrates a System in Package (SIP) 100 that may be fabricated using a substrate according to embodiments of the present invention, which substrate 120 may implement one or multiple capacitive elements (as well as, optionally, various additional components for example passive components, interconnect, and so on).

In the SIP 100 of FIG. 9 a substrate 120 according to an embodiment of the invention is flip-chip bonded to a mounting substrate 130, which may be a lead frame. An active die 110 including an integrated circuit 115 is flip chip bonded to the substrate 120. Thus, the substrate 120 according to the invention is integrated with the integrated circuit 115.

Figure 10:
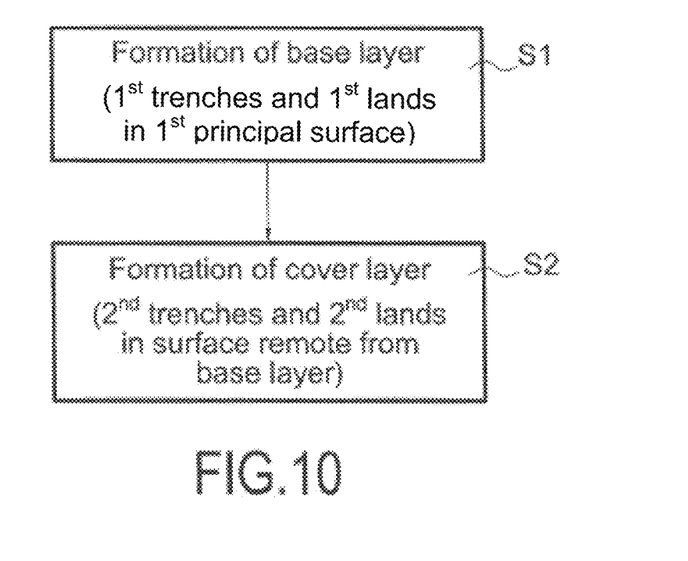
FIG. 10 is a flow diagram, illustrating steps in a fabrication method according to an embodiment of the invention.

FIG. 10 illustrates a method of fabricating a multi-order textured substrate according to embodiments of the present invention. The illustrated method includes forming (S1) a base layer 2 having a first principal surface (2A) defining a plurality of first trenches 3 and intervening first lands (4). When the base layer 2 has been formed, a cover layer 12 is formed (S2) over the first principal surface 2A of the base layer 2 to conformally cover the first trenches 3 and first lands 4. The surface 12A of the cover layer remote from the first principal surface 2A of the base layer comprises a plurality of second trenches 13 and intervening second lands 14 defined at a smaller scale than the first trenches and first lands.

The texture in base layer 2 may be formed in various ways, for example using the subtractive process or additive process described above.

The texture in the surface 12A of the cover layer 12 may be created in various ways. In one example fabrication process, an aluminum layer is deposited to conformally cover the first trenches 3 and first lands 4 of the base layer 2, and then an anodization process is performed to create pores in the aluminum layer. In the case where an anodization stop layer, such as the layer 11 of FIG. 2, is deposited before deposition of the aluminum layer, an oxide layer (e.g. TiOx, WOx, etc.) is formed at the bottom of each pore. If desired, a selective etching process may then be performed to etch away oxide at the bottom of the pore while leaving $Al_2O_3$ on the sidewalls of the pore, for example making use of a potassium- or sodium-based buffered etch solution. In a case where a metal layer, such as layer 10 of FIG. 2, underlies the anodization stop layer 11 this approach may allow electrical connection to be made at the bottom of the pore to the metal layer 10.

Although the present invention has been described above with reference to certain specific embodiments, it will be understood that the invention is not limited by the particularities of the specific embodiments. Numerous variations, modifications and developments may be made in the specified embodiments within the scope of the appended claims.

The invention claimed is:

1. A substrate comprising a base layer having a first principal surface defining a plurality of first trenches and intervening first lands, wherein the substrate includes a cover layer having a thickness greater than 5 μm provided over said first principal surface of the base layer and covering the first trenches and first lands substantially conformally, wherein:
   the surface of the cover layer remote from the first principal surface of the base layer comprises a plurality of second trenches and intervening second lands defined at a smaller scale than the first trenches and first lands, and
   the width of the first lands is greater than 1 μm.

2. The substrate according to claim 1, wherein the first trenches have sidewalls extending at an angle of ≤90° to the first principal surface of the base layer.

3. The substrate according to claim 1, wherein the first trenches interconnect and form a continuous contour that intersects with itself.

4. The substrate according to claim 1, wherein the cover layer is an anodized layer and the second trenches are pores in the anodized layer.

5. The substrate according to claim 1, wherein the cover layer is electrically conductive and a first thin film layer is provided over, and covers substantially conformally, the second trenches and second lands of the cover layer, the first thin film layer being electrically insulating or electrically conductive.

6. The substrate according to claim 5, wherein the first thin film layer is electrically insulating and a second thin film layer is provided over, and covers substantially conformally, the first thin film layer, the second thin film layer being electrically conductive.

7. A capacitive element comprising a substrate according to claim 6.

8. A chemical sensor element comprising a substrate according to claim 6, wherein the first thin film layer is a chemical sensing layer adapted to adsorb selected molecules.

9. The substrate according to claim 1, wherein the cover layer is electrically insulating and a stack of three thin film layers are provided over, and cover substantially conformally, the second trenches and second lands, the first layer of the stack being electrically conductive, the second layer of the stack being electrically insulating and the third layer of the stack being electrically conductive.

10. The substrate according to claim 9, wherein an electrical contact is made to the first layer of the stack through the bottom of the second trenches.

11. A system in a package module comprising a substrate according to claim 1 monolithically integrated with an integrated circuit.

12. A method of fabricating a substrate, comprising:
   forming a base layer having a first principal surface defining a plurality of first trenches and intervening first lands, and
   forming a cover layer over said first principal surface of the base layer to cover substantially conformally the first trenches and first lands, the surface of the cover layer remote from the first principal surface of the base layer comprising a plurality of second trenches and intervening second lands defined at a smaller scale than the first trenches and first lands; and
   wherein the width of the first lands is greater than 1 μm.

13. The fabrication method according to claim 12, wherein forming the base layer comprises etching a principal surface of the base layer to form the first trenches and first lands, or providing a second sub-base-layer on a first sub-base-layer, wherein the first lands and the sidewalls of the first trenches are formed by portions of the second sub-base-layer.

* * * * *